United States Patent
Saito et al.

(10) Patent No.: US 10,585,222 B2
(45) Date of Patent: Mar. 10, 2020

(54) PATTERNED PHASE DIFFERENCE FILM, VIEWING ANGLE SWITCHING POLARIZING PLATE, VIEWING ANGLE SWITCHING SYSTEM, AND DISPLAY DEVICE

(71) Applicant: FUJIFILM CORPORATION, Minato-ku, Tokyo (JP)

(72) Inventors: Yukito Saito, Kanagawa (JP); Yujiro Yanai, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 16/191,450

(22) Filed: Nov. 15, 2018

(65) Prior Publication Data

US 2019/0079232 A1    Mar. 14, 2019

Related U.S. Application Data

(63) Continuation of application No. PCT/JP2017/018412, filed on May 16, 2017.

(30) Foreign Application Priority Data

May 20, 2016    (JP) ................................. 2016-101060

(51) Int. Cl.
     *G02F 1/1335*    (2006.01)
     *G02B 5/30*    (2006.01)
     (Continued)

(52) U.S. Cl.
     CPC ............. *G02B 5/3016* (2013.01); *G02B 5/30* (2013.01); *G02F 1/1323* (2013.01);
     (Continued)

(58) Field of Classification Search
     CPC .............. G02F 1/1335; G02F 1/13363; G02F 1/133528; G02F 1/1323;
     (Continued)

(56) References Cited

U.S. PATENT DOCUMENTS

2007/0146608 A1    6/2007    Jin et al.
2008/0170183 A1    7/2008    Sugiyama

FOREIGN PATENT DOCUMENTS

JP    H10-62623 A    3/1998
JP    2004-279866 A    10/2004
     (Continued)

OTHER PUBLICATIONS

International Search Report issued in International Application No. PCT/JP2017/018412 dated Aug. 15, 2017.

(Continued)

*Primary Examiner* — Thoi V Duong
(74) *Attorney, Agent, or Firm* — Solaris Intellectual Property Group, PLLC

(57) ABSTRACT

A patterned phase difference film has an optically anisotropic layer alternately having a first phase difference region and a second phase difference region, in which the first phase difference region and the second phase difference region contain rod-like liquid crystals or discotic liquid crystals in the form of a hybrid alignment with mutually opposite rising directions of tilt angles, and has a hybrid alignment in which directions of in-plane slow axes and absolute values of in-plane phase differences of the first phase difference region and the second phase difference region are equal in a range of 54 to 74 nm, and in each of the first phase difference region and the second phase difference region, one of an absolute value of a phase difference at a polar angle of 40° and an absolute value of a phase difference at a polar angle of −40° is 135 to 353 nm and the other is 8 to 28 nm.

8 Claims, 8 Drawing Sheets

(51) Int. Cl.
*G02F 1/13363* (2006.01)
*H01L 27/32* (2006.01)
*G02F 1/13* (2006.01)
*H01L 51/52* (2006.01)
*B29D 11/00* (2006.01)

(52) U.S. Cl.
CPC ........ *G02F 1/1335* (2013.01); *G02F 1/13363* (2013.01); *G02F 1/133528* (2013.01); *H01L 27/3232* (2013.01); *H01L 51/5281* (2013.01); B29D 11/0073 (2013.01); *G02F 2001/133631* (2013.01); *G02F 2001/133633* (2013.01); *H01L 51/5275* (2013.01)

(58) Field of Classification Search
CPC ........ G02F 2001/133631; G02F 2001/133633; G02F 2413/09; G02F 2413/105; G02B 5/3083; G02B 5/3016; G02B 5/30; G02B 5/3025; B29D 11/0073; H01L 27/3232; H01L 51/5281; H01L 51/5275
See application file for complete search history.

(56) References Cited

FOREIGN PATENT DOCUMENTS

| | | |
|---|---|---|
| JP | 2007-178979 A | 7/2007 |
| JP | 2008-0175857 A | 7/2008 |
| JP | 2010-139661 A | 6/2010 |
| WO | 2015/033932 A1 | 3/2015 |

OTHER PUBLICATIONS

Written Opinion of the ISA issued in International Application No. PCT/JP2017/018412 dated Aug. 15, 2017.
English language translation of the following: Office action dated Oct. 15, 2019 from the JPO in a Japanese patent application No. 2018-518316 corresponding to the instant patent application.

(ii)

PATTERNED PHASE DIFFERENCE FILM, VIEWING ANGLE SWITCHING POLARIZING PLATE, VIEWING ANGLE SWITCHING SYSTEM, AND DISPLAY DEVICE

CROSS-REFERENCE TO RELATED APPLICATIONS

This application is a continuation application of International Application No. PCT/JP2017/018412, filed May 16, 2017, the disclosure of which is incorporated herein by reference in its entirety. Further, this application claims priority from Japanese Patent Application No. 2016-101060, filed May 20, 2016, the disclosure of which is incorporated herein by reference in its entirety.

BACKGROUND OF THE INVENTION

1. Field of the Invention

The present invention relates to a patterned phase difference film that can be used as a viewing angle control panel for making a viewing angle changeable in a display device such as a liquid crystal display device or an organic electroluminescent display device. The present invention also relates to a viewing angle switching polarizing plate including the patterned phase difference film, a viewing angle switching system, and a display device.

2. Description of the Related Art

In electronic devices for personal use such as a tablet personal computer (PC), a laptop PC, and a mobile phone such as a smartphone, there is a demand for preventing a screen from being peeped by a peripheral third party. Therefore, in these electronic devices, the viewing angle of the screen is narrowed.

As a method of narrowing the viewing angle of a screen, a method of bonding a film in which black stripes are formed (louver film) or the like to a screen has been known.

However, in this method, the screen is fixed in a state in which the viewing angle of the screen is narrow. Therefore, for example, in a case where a screen is needed to be visually recognized in an oblique direction, such as a case where several persons visually recognize a screen, the visibility in the oblique direction is deteriorated and the usability of electronic devices is deteriorated.

In order to solve such problems, in electronic devices such as a tablet PC and a laptop PC, various display devices capable of switching between a display at a wide viewing angle and a display at a narrow viewing angle to realize security such as prevention of a peep from the side and if necessary, sufficient visibility from the side have been proposed.

For example, JP2007-178979A discloses a liquid crystal display device having a first substrate having gate wirings and data wirings corresponding to subpixels of red (R), green (G), blue (B), and white (W), a thin film transistor disposed at each crossing points of the gate wirings and the data wirings, a plate type first common electrode disposed in the subpixels of R, G, B, and W, a pixel electrode having a plurality of slits, connected to the thin film transistor and insulated from the first common electrode, a second substrate bonded to face the first substrate and including a liquid crystal layer in a space between the second substrate and the first substrate, and a plate type second common electrode formed on the second substrate so as to correspond to each W subpixels.

In the liquid crystal display device, in a case of a wide viewing angle display, the viewing angle can be widened by driving the W subpixel in a FFS mode like subpixels adjacent to R, G, and B and the W luminance can also be compensated, and in a case of a narrow viewing angle display, the viewing angle can be narrowed by driving the W subpixel in an ECB mode forming a vertical electric field unlike subpixels adjacent to R, G, and B.

JP2004-279866A discloses a display device including a screen having a viewing angle limited in a one-dimensional direction, and image display switching means for switching between a personal view mode in which an erection direction of an image displayed on the screen is approximately orthogonal to the viewing angle limiting direction and a multi-view mode in which the erection direction of the image coincides with the viewing angle limiting direction.

That is, in this display device, depending on whether or not the viewing angle of the screen is limited in the one-dimensional direction by using a microprism sheet or the like, and the top and the bottom of the image are made to coincide with the viewing angle limiting direction by rotating the image by 90°, a wide viewing angle display and a narrow viewing angle display can be switched.

According to these display devices, display visual recognition in a state in which a peep of a third party from the side can be prevented and appropriate display visual recognition for several persons can be achieved with one display device by switching between a wide viewing angle display and a narrow viewing angle display.

SUMMARY OF THE INVENTION

However, in the display device disclosed in JP2007-178979A, a plurality of substrates and the W subpixel not provided in a normal display device are required and thus the device configuration is complicated.

On the other hand, in the display device disclosed in JP2004-279866A, it is required to rotate an image by 90° to switch between a wide viewing angle display and a narrow viewing angle display, and thus extra image processing is required. In a normal display device, the aspect ratio of an image is different. Thus, in this display device, the aspect ratio of the image is different in a wide viewing angle display and a narrow viewing angle display.

In view of the above circumstances, an object of the present invention is to provide a display device capable of switching a normal viewing angle display and a narrow viewing angle display with a limited viewing angle with a simple configuration in a display device used for a tablet PC or a laptop PC without performing image processing or the like. In addition, another object thereof is to provide a patterned phase difference film, a viewing angle switching polarizing plate, and a viewing angle switching system for realizing such a display device.

According to an aspect of the present invention, there is provided a patterned phase difference film comprising: an optically anisotropic layer alternately having a first phase difference region and a second phase difference region, in which the first phase difference region and the second phase difference region contain rod-like liquid crystals or discotic liquid crystals in the form of a hybrid alignment with mutually opposite rising directions of tilt angles, directions of in-plane slow axes and absolute values of in-plane phase differences of the first phase difference region and the second phase difference region are equal and the absolute values of in-plane phase differences are 54 to 74 nm, and when in a case where the first phase difference region and the second phase difference region contain the rod-like liquid crystals, an in-plane slow axis is set to an x axis, and in a case where the first phase difference region and the second phase difference region contain the discotic liquid crystals, an in-plane fast axis is set to an x axis, and a direction vertical to a film surface is set to a z axis, in each of the first phase difference region and the second phase difference region, one of an absolute value of a phase difference at a polar angle of 40° and an absolute value of a phase difference at a polar angle of −40° in an xz plane is 135 to 353 nm and the other is 8 to 28 nm.

It is preferable that in the patterned phase difference film according to the aspect of the present invention, the first phase difference region and the second phase difference region have the same stripe shape and are alternately arranged in a width direction of the stripe shape.

In addition, in this case, it is preferable that, in a case where the first phase difference region and the second phase difference region contain the rod-like liquid crystals, an in-plane slow axis coincides with a length direction of the stripe shape, and in a case where the first phase difference region and the second phase difference region contain the discotic liquid crystals, an in-plane fast axis coincides with the length direction of the stripe shape.

In the patterned phase difference film according to the aspect of the present invention, the first phase difference region and the second phase difference region may have the same rectangular shape and may be alternately arranged in a check pattern in vertical and horizontal directions.

According to another aspect of the present invention, there is provided a viewing angle switching polarizing plate comprising: the patterned phase difference film according to the aspect of the present invention; and a polarizer,
in which the patterned phase difference film and the polarizer are laminated,
an in-plane slow axis in a case where the first phase difference region and the second phase difference region of the patterned phase difference film contain the rod-like liquid crystals, or an in-plane fast axis in a case where the first phase difference region and the second phase difference region of the patterned phase difference film contain the discotic liquid crystals, and an absorption axis of the polarizer are parallel to each other.

According to still another aspect of the present invention, there is provided a viewing angle switching system comprising: two viewing angle switching polarizing plates described above,
in which the two viewing angle switching polarizing plates are arranged such that the absorption axes of the polarizers are parallel to each other and the patterned phase difference films face each other, and are provided to be relatively movable between a first relative position and a second relative position,
the first relative position is a position where mutually different phase difference regions of the patterned phase difference films arranged to face each other coincide with each other in a lamination direction, and
the second relative position is a position where the mutually same phase difference regions of the patterned phase difference films arranged to face each other coincide with each other in the lamination direction.

According to still another aspect of the present invention, there is provided a display device comprising: a display panel; and the viewing angle switching system that is arranged on a viewing side surface of the display panel.

The display device according to the aspect of the present invention may be a liquid crystal panel, and a polarizer on a viewing side of the liquid crystal panel may also function as a polarizer on a side of the liquid crystal panel of a viewing angle switching polarizing plate of the two viewing angle switching polarizing plates constituting the viewing angle switching system.

The patterned phase difference film of the present invention includes an optically anisotropic layer alternately having a first phase difference region and a second phase difference region, in which the first phase difference region and the second phase difference region contain rod-like liquid crystals or discotic liquid crystals in the form of a hybrid alignment with mutually opposite rising directions of tilt angles, directions of in-plane slow axes and absolute values of in-plane phase differences of the first phase difference region and the second phase difference region are equal and the absolute values of in-plane phase differences are 54 to 74 nm, and when in a case where the first phase difference region and the second phase difference region contain the rod-like liquid crystals, an in-plane slow axis is set to an x axis, and in a case where the first phase difference region and the second phase difference region contain the discotic liquid crystals, an in-plane fast axis is set to an x axis, and a direction vertical to a film surface is set to a z axis, in each of the first phase difference region and the second phase difference region, one of an absolute value of a phase difference at a polar angle of 40° and an absolute value of a phase difference at a polar angle of −40° in an xz plane is 135 to 353 nm and the other is 8 to 28 nm. It is possible to provide a display device capable of switching between a normal viewing angle display (wide viewing angle display) and a narrow viewing angle display with a viewing angle limited to be in a range narrower than a normal viewing angle range with a simple configuration without image processing or the like by combining two patterned phase difference film having the configuration.

DESCRIPTION OF THE PREFERRED EMBODIMENTS

Hereinafter, embodiments of a patterned phase difference film, a viewing angle switching polarizing plate, a viewing angle switching system, and a display device of the present invention will be described with reference to the accompanying drawings.

<Patterned Phase Difference Film>

A patterned phase difference film according to an embodiment of the present invention comprises an optically anisotropic layer alternately having a first phase difference region and a second phase difference region in which directions of in-plane slow axes and absolute values of in-plane phase differences are equal. The patterned phase difference film of the embodiment of the present invention may be constituted of a single layer film of only an optically anisotropic layer and may be constituted of a laminate film comprising an optically anisotropic layer provided on other layers such as a support film and an alignment film. The first phase difference region and the second phase difference region have discotic liquid crystals (DLC) or rod-like liquid crystals in the form of a hybrid alignment with mutually opposite rising directions of tilt angles. Here, the tilt angle refers to the inclination of a fast axis $D_f$ of a disk-like DLC molecule (an axis vertical to the disc plane) or a slow axis $D_s$ of a rod-like liquid crystal molecule (a long axis of the rod) with respect to a principal surface (film surface) of the film. The hybrid alignment refers to a state in which DLC molecules or rod-like liquid crystal molecules are fixed such that the tilt angle continuously changes from one film surface to the other film surface.

In the patterned phase difference film of the embodiment of the present invention, the absolute value of an in-plane phase difference R(0) is 54 to 74 nm. When an in-plane slow axis in a case where rod-like liquid crystals are contained is set to an x axis, or an in-plane fast axis in a case where discotic liquid crystals are contained is set to an x axis, and a normal line of the film surface is set to a z axis, one of the absolute value of a phase difference R(40) at a polar angle of 40° and the absolute value of a phase difference R(−40) at a polar angle of −40° in the xz plane in each of the first phase difference region and the second phase difference region is 135 to 353 nm, and the other is 8 to 28 nm. Incidentally, one pair of values of the absolute values of the phase difference phase differences in the first phase difference region and the second phase difference region and others are substantially equal to each other. This means that the absolute values of the average tilt angles of the first phase difference region and the second phase difference region are substantially equal to each other. Here, the substantially equal absolute values of the phase difference mean that the absolute values are equal in a range of ±5 nm.

Figure 1A:
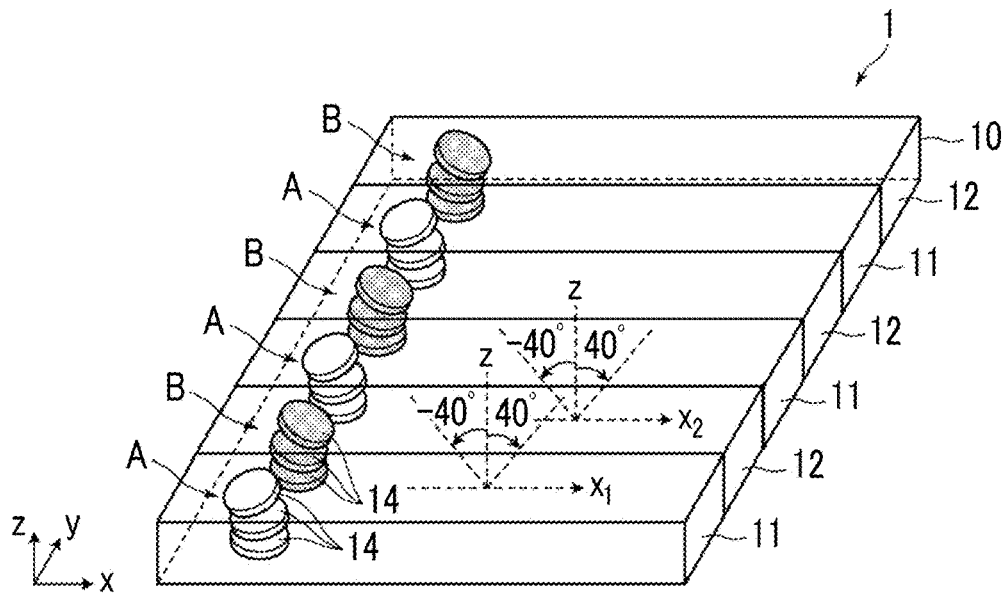
FIG. 1A is a schematic perspective view of a patterned phase difference film according to a first embodiment.

FIG. 1A shows a schematic perspective view of a patterned phase difference film 1 according to a first embodiment. In each schematic view including FIG. 1A, the actual state of the film is described by emphasizing and schematically representing the characteristics for the purpose of explanation.

The patterned phase difference film 1 of the embodiment is formed of an optically anisotropic layer 10 alternately having a first phase difference region 11 and a second phase difference region 12 containing DLCs. In the embodiment, the first phase difference region 11 and the second phase difference region 12 have the same stripe shape and are alternately arranged in the width direction of the stripe shape. Here, the same stripe shape means that the size and the shape are the same as each other.

Figure 1B:
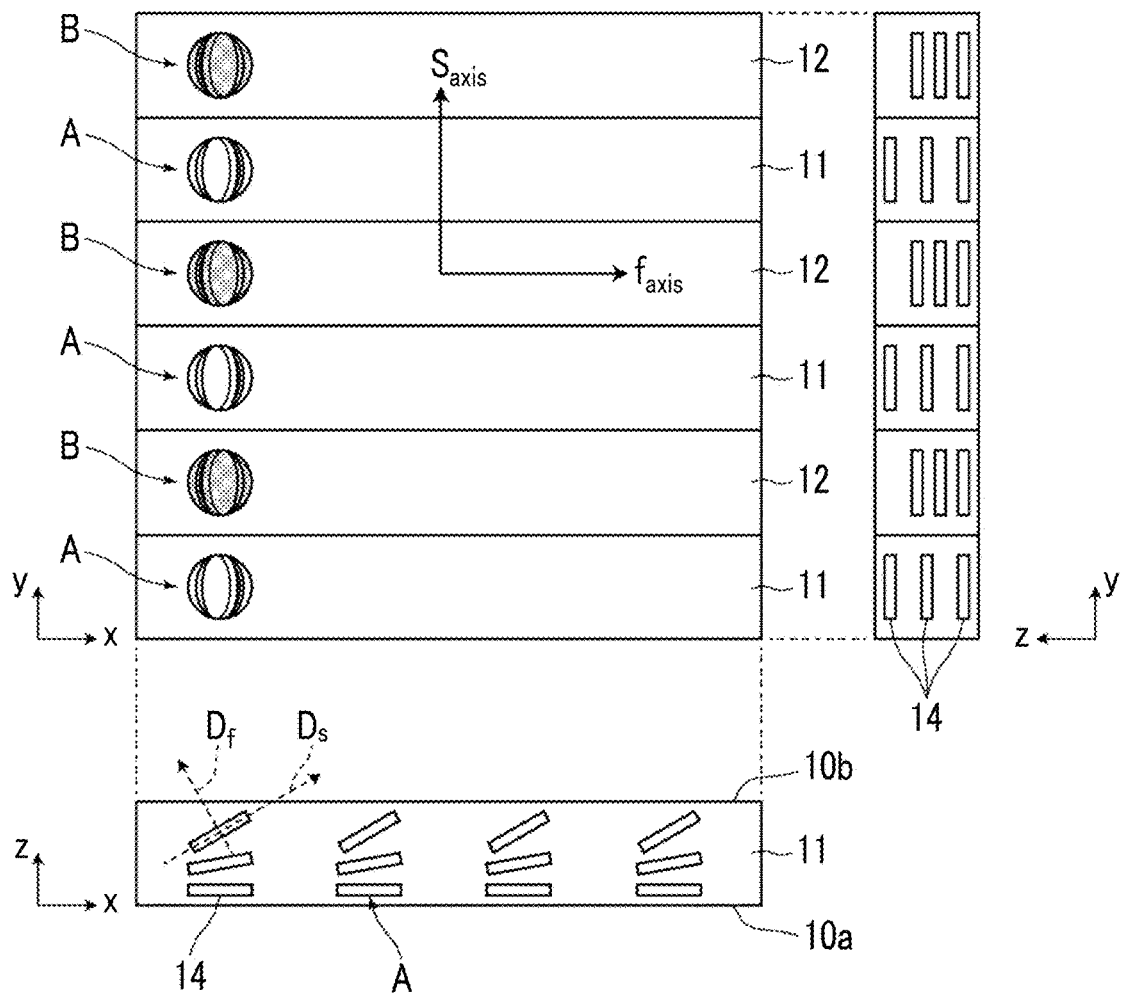
FIG. 1B is a view showing an upper surface and both side surfaces of the patterned phase difference film of FIG. 1A.

In FIG. 1A, an in-plane fast axis $f_{axis}$ of the patterned phase difference film 1 is defined as an x axis, an in-plane slow axis $S_{axis}$ orthogonal to the in-plane fast axis is defined as a y axis, and a normal line of a principal surface 10a of the optically anisotropic layer 10 (hereinafter, referred to as a film surface 10a) is defined as a z axis. FIG. 1B is a view schematically showing an upper surface (xy plane) of the patterned phase difference film 1, a side surface (zy plane) of the first and second phase difference regions 11 and 12 in an arrangement direction, and a side surface (xz plane) of the first phase difference region 11 in a length direction respectively.

As shown in FIGS. 1A and 1B, in the plane (xz plane) which is vertical to the film surface 10a and is formed in the length direction of the stripe-shaped region, a plurality of DLC molecules 14 are fixed in the form of a hybrid alignment in which the inclination of the fast axis $D_f$ thereof gradually changes from one film surface 10a to the other film surface 10b. In the first phase difference region 11 and the second phase difference region 12, the rising directions of the tilt angles are opposite to each other and the absolute values of the average tilt angles are the same. Hereinafter, a group of hybrid alignment DLC molecules 14 of the first phase difference region 11 is referred to as a first hybrid alignment liquid crystal group A, and a group of hybrid alignment DLC molecules 14 of the second phase difference region 12 is referred to as a second hybrid alignment liquid crystal group B.

As shown in FIG. 1A, in the first phase difference region 11 and the second phase difference region 12, a y axis component is not changed among the DLC molecules of each of the liquid crystal groups A and B and only an x axis component is changed. This means that the directions of the in-plane slow axes of the first phase difference region 11 including the liquid crystal group A and the second phase difference region 12 including the liquid crystal group B coincide with each other.

As shown in FIG. 1A, the absolute values of the phase differences at a polar angle of 0°, that is, the in-plane phase differences R(0) in the first phase difference region 11 and the second phase difference region are substantially equal, and the absolute values thereof are 54 to 74 nm. The absolute value of the in-plane phase difference R(0) is more preferably 60 to 70 nm and particularly preferably 63 to 67 nm.

In the first phase difference region 11, the large one of the absolute value of a phase difference $R_1(40)$ at a polar angle of 40° and the absolute value of a phase difference $R_1(−40)$ at a polar angle of −40° in the xz plane is 135 to 353 nm and the small one is 8 to 28 nm.

Similarly, in the second phase difference region 12, the large one of the absolute value of a phase difference $R_2(40)$ at a polar angle of 40° and the absolute value of a phase difference $R_2(−40)$ at a polar angle of −40° in the xz plane is 135 to 353 nm and the small one is 8 to 28 nm.

The degree of hybrid alignment of the first phase difference region and the second phase difference region is substantially the same and thus $R_1(40) \cong R_2(-40)$, and $R_1(-40) \cong R_2(40)$.

In the present invention, the term "phase difference" is defined as a phase difference at a wavelength of 550 nm unless otherwise specified.

In the present invention, the in-plane phase difference Re is a value ($=R(0)$) measured by causing light having a wavelength of 550 nm to be incident to the film surface in a direction normal to the film surface (at a polar angle of 0° in the spherical coordinate system having the xyz axes) in AxoScan (manufactured by Axometrics Co. Ltd.). In addition, the phase differences R(40) and R(−40) are values measured by causing light having a wavelength of 550 nm to be incident to the film surface at polar angles of 40° and −40°, respectively.

The optically anisotropic layer 10 having the first phase difference regions 11 and the second phase difference regions 12 containing the DLCs can be prepared by applying an optically anisotropic layer coating solution (DLC composition) including DLCs to a patterned alignment film which will be described later and curing the coating solution.

Figure 2A:
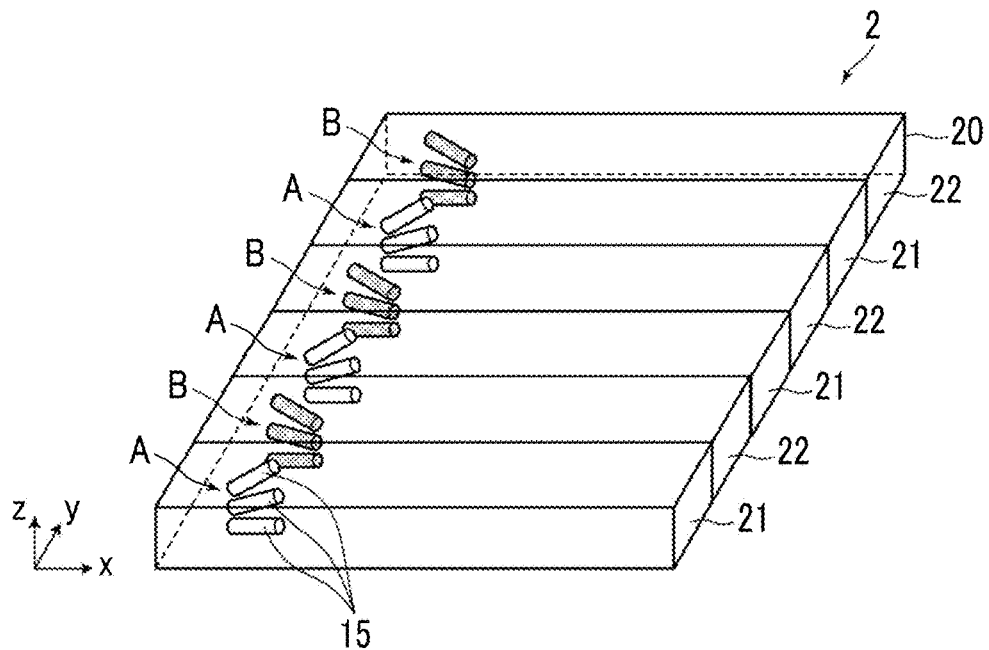
FIG. 2A is a schematic perspective view of a patterned phase difference film according to a second embodiment.

FIG. 2A shows a schematic perspective view of a patterned phase difference film according to a second embodiment.

A patterned phase difference film 2 of an embodiment is formed of an optically anisotropic layer 20 alternately having a first phase difference region 21 and a second phase difference region 22 containing rod-like liquid crystals. This embodiment is the same as the first embodiment in that the first phase difference region 21 and the second phase difference region 22 have the same stripe shape and are alternately arranged in a width direction of the stripe shape.

Figure 2B:
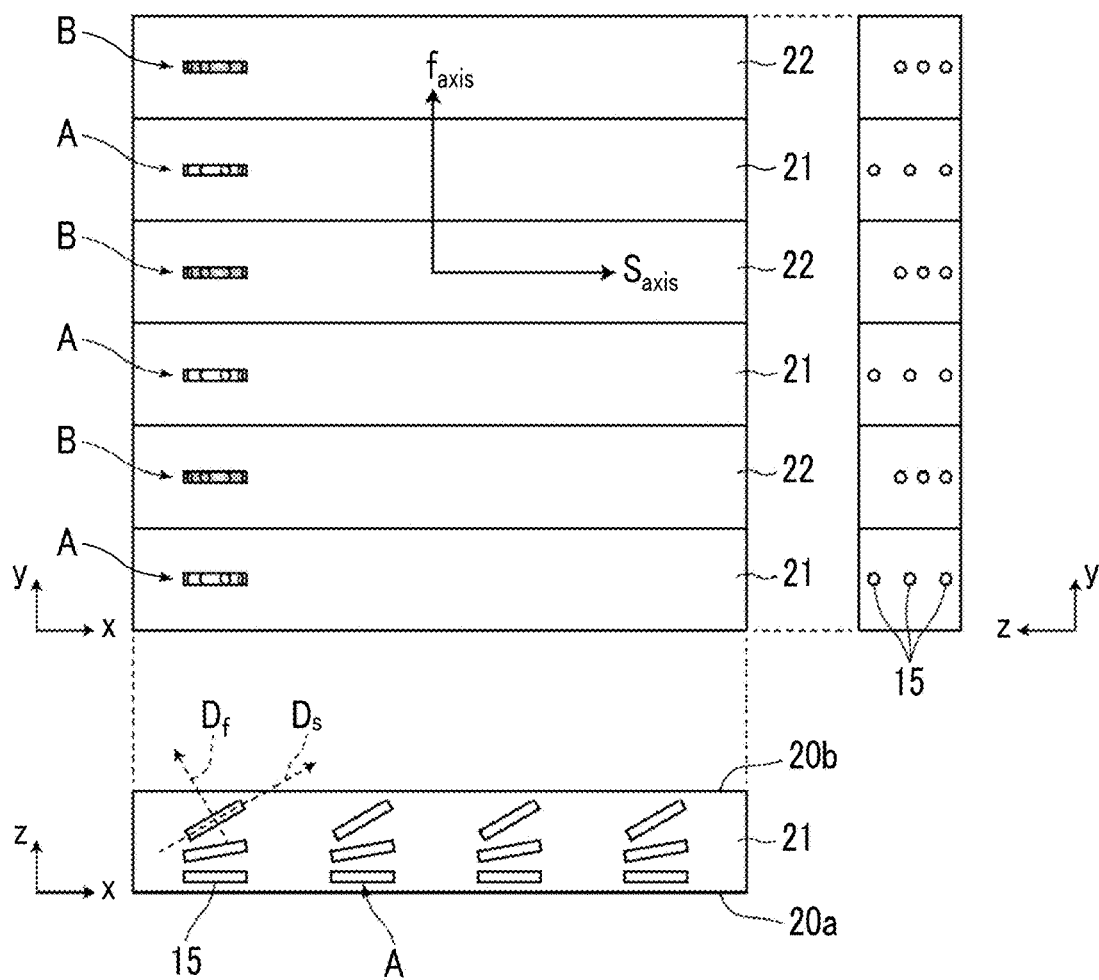
FIG. 2B is a view showing an upper surface and both side surfaces of the patterned phase difference film of FIG. 2A.

In FIG. 2A, the in-plane slow axis $S_{axis}$ of the patterned phase difference film 2 is defined as an x axis, an in-plane fast axis $f_{axis}$ orthogonal to the in-plane slow axis is defined as a y axis, and a normal line of a principal surface 20a of the optically anisotropic layer 20 (hereinafter, referred to as a film surface 20a) is defined as a z axis. FIG. 2B schematically shows an upper surface (xy plane) of the patterned phase difference film 2, a side surface (zy plane) of the first and second phase difference regions 21 and 22 in an arrangement direction, and a side surface (xz plane) of the first phase difference region 21 in a length direction respectively.

As shown in FIGS. 2A and 2B, in the plane (xz plane) which is vertical to the film surface 20a and is formed in the length direction of the stripe-shaped region, a plurality of rod-like liquid crystal molecules 15 are fixed in the form of a hybrid alignment in which the inclination of a long axis thereof (a slow axis in the rod-like liquid crystal molecule) gradually changes from one film surface 20a to the other film surface 20b. Then, in the first phase difference region 21 and the second phase difference region 22, the rising directions of the tilt angles are opposite to each other and the absolute values of the average tilt angles are the same. In addition, as seen from the film normal direction z, the slow axis of the rod-like liquid crystal molecules 15 are all aligned in the x axis direction in the first phase difference region 21 and the second phase difference region 22. That is, the directions of the in-plane slow axes in the first phase difference region 21 and the second phase difference region 22 coincide with each other.

Hereinafter, as in the first embodiment, a group of hybrid alignment rod-like liquid crystal molecules 15 of the first phase difference region 21 is referred to as a first hybrid alignment liquid crystal group A, and a group of hybrid alignment rod-like liquid crystal molecules 15 of the second phase difference region 22 is referred to as a second hybrid alignment liquid crystal group B.

In the patterned phase difference film 2 of the embodiment, the in-plane phase difference R(0), the phase difference R(40) at a polar angle of 40°, and the phase difference R(−40) at a polar angle of −40° are the same as those of the patterned phase difference film 1 of the first embodiment.

The optically anisotropic layer 20 having the first phase difference regions 21 and the second phase difference regions 22 containing the rod-like liquid crystals can be prepared by applying an optically anisotropic layer coating solution (rod-like liquid crystal composition) including rod-like liquid crystals on a patterned alignment film which will be described later and curing the coating solution.

In the patterned phase difference film 1 of the first embodiment, the configuration in which the in-plane fast axes $f_{axis}$ of the first phase difference region 11 and the second phase difference region 12 coincide with each other in the length direction of the stripe has been described. However, the directions of the in-plane fast axes may coincide with each other in the first phase difference region 11 and the second phase difference region 12, and for example, the DLC molecules may be aligned such that the in-plane fast axes are directed to the width direction of the stripe shape orthogonal to the length direction of the stripe.

In the same manner, in the patterned phase difference film 2 of the second embodiment, the configuration in which the in-plane slow axes $S_{axis}$ of the first phase difference region 21 and the second phase difference region 22 coincide with each other in the length direction of the stripe has been described. However, the directions of the in-plane slow axes in the first phase difference region 21 and the second phase difference region 22 may coincide with each other and for example, the rod-like liquid crystal molecules may be aligned such that the in-plane slow axes are directed to the width direction of the stripe shape orthogonal to the length direction of the stripe.

Figure 3:
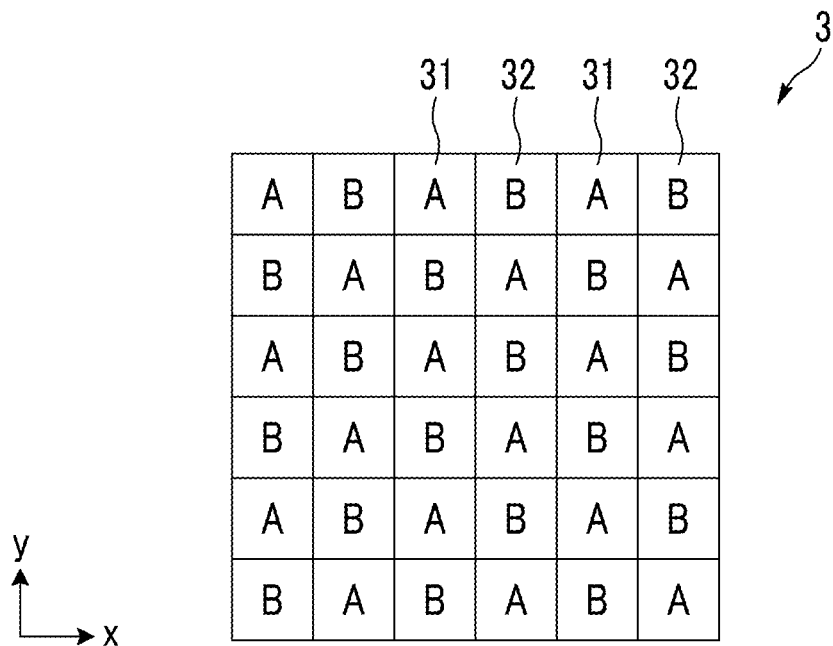
FIG. 3 is a schematic plan view of another example of the patterned phase difference film.

Further, the shape of the first phase difference region and the second phase difference region in the patterned phase difference film is not limited to a stripe shape and as in a patterned phase difference film 3 of another example shown in a schematic plan view in FIG. 3, a first phase difference region 31 including a first hybrid alignment liquid crystal group A and a second phase difference region 32 including a second hybrid alignment liquid crystal group B may have the same rectangular shape (here, square shape) and may be alternately arranged in a check pattern in vertical and horizontal directions.

The configurations in which the patterned phase difference films 1 and 2 of the first and second embodiments are formed of only the optically anisotropic layer having the first phase difference regions and the second phase difference regions. However, the patterned phase difference film of the embodiment of the present invention may comprise a support film or may further comprise a support film and an alignment film as well as the optically anisotropic layer.

Figure 4:
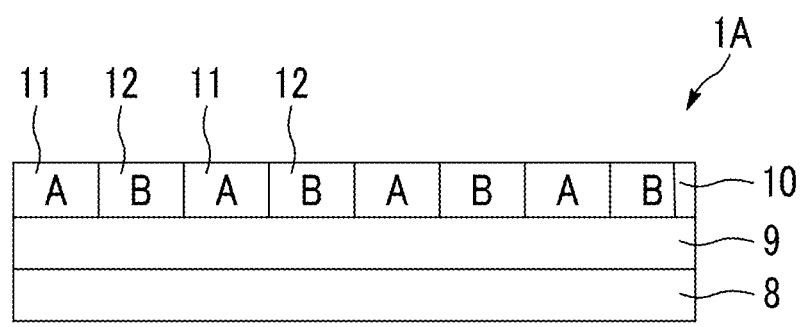
FIG. 4 is a schematic cross-sectional view of still another example of a patterned phase difference film.

FIG. 4 is a schematic cross-sectional view of still another example of a patterned phase difference film 1A comprising a uniform alignment film 9 on a support film 8 and further comprising an optically anisotropic layer 10 having first phase difference regions 11 and second phase difference regions 12 on the alignment film 9.

In a case where layers other than the optically anisotropic layer 10, such as the support film 8 and the alignment film 9, are provided as in the patterned phase difference film 1A, all of the in-plane phase difference R(0), the phase difference R(40) at a polar angle of 40°, and the phase difference R(−40) at a polar angle of −40° are values measured for the entire patterned phase difference film 1A including layers other than the optically anisotropic layer 10, such as the support film 8 and the alignment film 9.

For example, the alignment film 9 is a patterned alignment film having first and second alignment control regions in which liquid crystal molecules included in the optically anisotropic layer to be formed on the alignment film can be controlled such that the long axes of the liquid crystal molecules are aligned in the same direction and the rising directions of tilt angles of hybrid alignment liquid crystal molecules (signs of inclination angles) are made different from each other. The patterned alignment film can be formed by, for example, forming an alignment film and then performing a mask rubbing treatment on the alignment film.

In addition, the patterned alignment film is formed and used to form an optically anisotropic layer having first phase difference regions and second phase difference regions on a temporary support, and the optically anisotropic layer is transferred onto the support film so that a patterned phase difference film can be formed in which the optically anisotropic layer is directly provided on the support film without the alignment film.

As the support film, a film containing, as a main component, a polymer or a resin excellent in light transmittance, mechanical hardness, heat stability, moisture blocking properties, isotropy and the like is preferable. Also, for the support film, it is preferable that the direction of the in-plane slow axis is random and the in-plane phase difference is small. For example, a support film described in WO2013/047282A and the like is suitable.

<Viewing Angle Switching Polarizing Plate>

A viewing angle switching polarizing plate of an embodiment of the present invention has at least the patterned phase difference film of the embodiment of the present invention, and a polarizer (linear polarizing film). The polarizer may be bonded to the surface of the optically anisotropic layer of the patterned phase difference film or may be bonded to the surface of the support film. In addition, another film (such as a polarizer protective film) may be arranged between the polarizer and the patterned phase difference film. As the film to be interposed between the polarizer and the patterned phase difference film, a film in which the in-plane slow axis is random and has a low phase difference is preferable.

Figure 5:
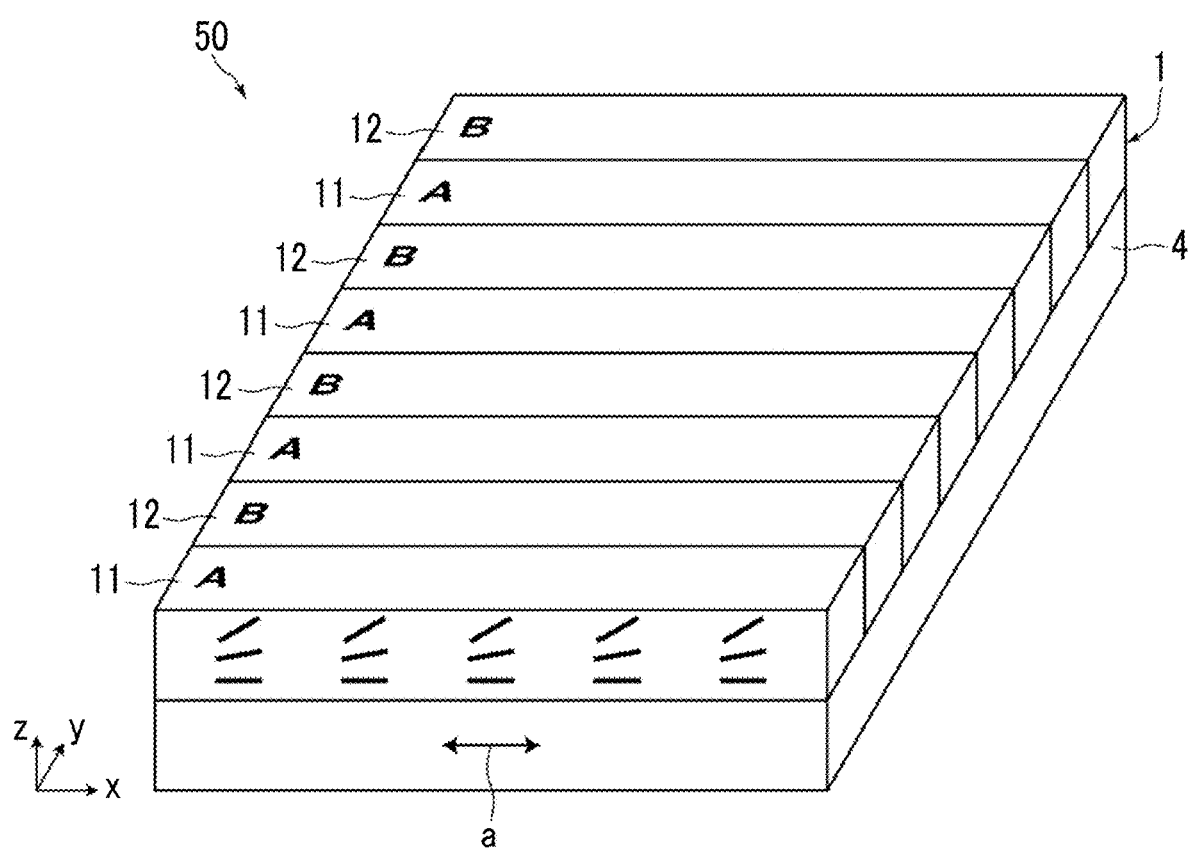
FIG. 5 is a schematic perspective view showing an example of a viewing angle switching polarizing plate of the present invention.

FIG. 5 is a schematic perspective view showing an example of a viewing angle switching polarizing plate.

As shown in FIG. 5, a viewing angle switching polarizing plate 50 is formed by laminating the patterned phase difference film 1 and a polarizer 4. In this case, the patterned phase difference film and the polarizer are laminated such that the in-plane fast axis direction of the patterned phase difference film 1 (coincident with the x axis) and an absorption axis a of the polarizer 4 are parallel to each other.

In a case where the viewing angle switching polarizing plate comprises the patterned phase difference film 2 including the rod-like liquid crystals shown in FIG. 2A, the viewing angle switching polarizing plate may be laminated such that the in-plane slow axis direction of the patterned phase difference film 2 (coincident with the x axis) and the absorption axis of the polarizer are parallel to each other.

<Viewing Angle Switching System and Display Device>

A viewing angle switching system of an embodiment of the present invention is formed of a combination of two viewing angle switching polarizing plates described above. Hereinafter, the viewing angle switching system and the display device comprising the viewing angle switching system of the embodiments of the present invention will be described.

Figure 6:
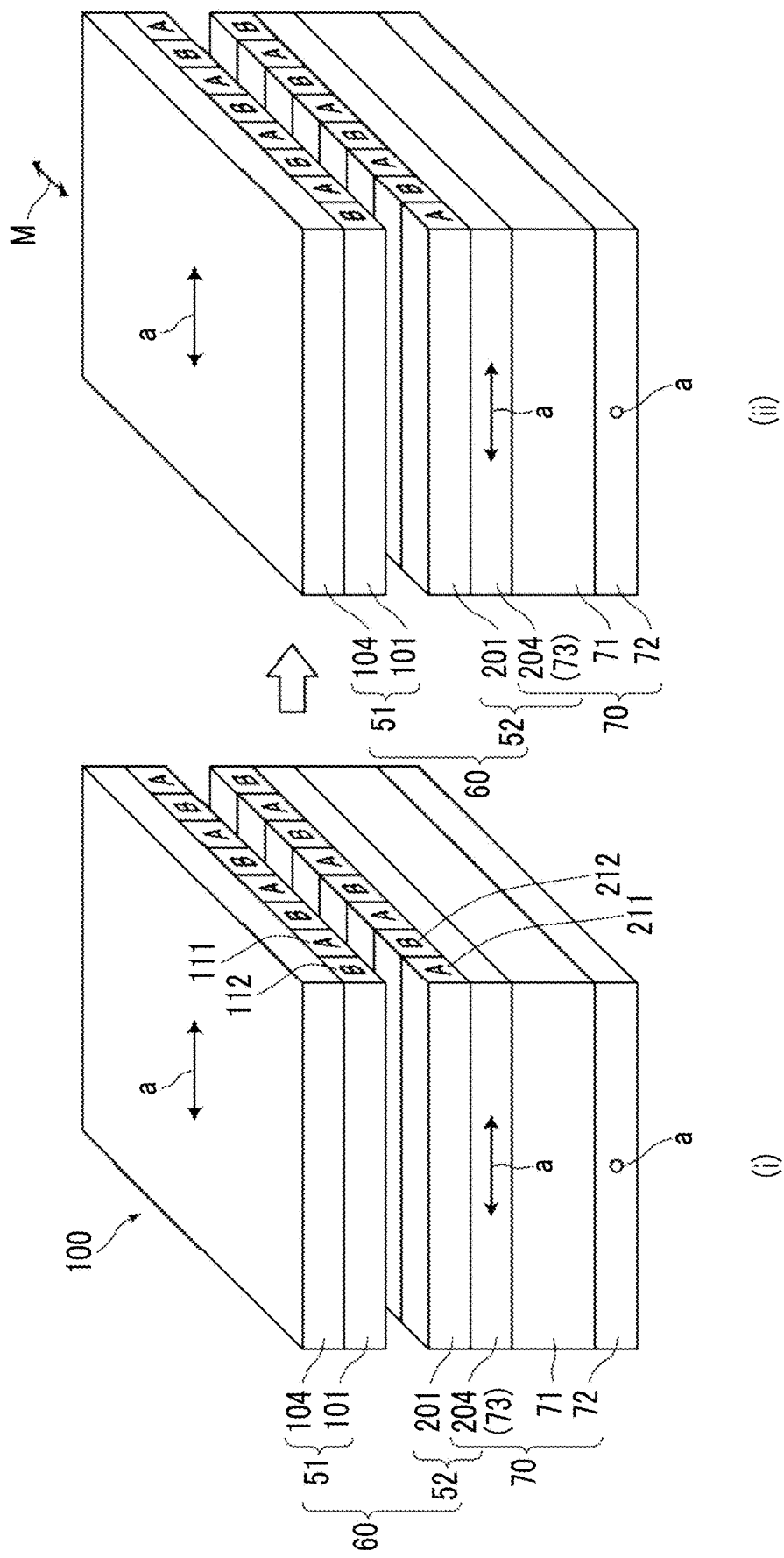
FIG. 6 is a schematic perspective view showing an example of a display device of the present invention.

FIG. 6 is a perspective view schematically showing an example of a display device of an embodiment of the present invention comprising a viewing angle switching system of an embodiment of the present invention. In FIG. 6, states of (i) normal viewing angle display mode and (ii) narrow viewing angle display mode by the viewing angle switching system are shown.

In a viewing angle switching system 60 of an embodiment, in order to distinguish between two viewing angle switching polarizing plates, one viewing angle switching polarizing plate is set to 51 and the other viewing angle switching polarizing plate is set to 52. As the reference numeral of each constitutional component in each of the polarizing plates 51 and 52, three-digit reference numerals obtained by adding 100 or 200 to the reference numerals corresponding to the constitutional components of the above-mentioned viewing angle switching polarizing plate 50 are used and the detailed descriptions thereof will be omitted.

The viewing angle switching system 60 has patterned phase difference films 101 and 201 that are arranged to face each other so that absorption axes a of polarizers 104 and 204 of the two viewing angle switching polarizing plates 51 and 52 are parallel to each other and to be relatively movable between a first relative position for normal viewing angle mode and a second relative position for narrow viewing angle mode.

As shown in (i) of FIG. 6, the first relative position is a position where the mutually different phase difference regions of the patterned phase difference films 101 and 201 coincide with each other in a lamination direction. In this case, the first phase difference region 111 of one patterned phase difference film 101 and the second phase difference region 212 of the other patterned phase difference film 201 coincide with each other in the lamination direction and the second phase difference region 112 of one patterned phase difference film 101 and the first phase difference region 211 of the other patterned phase difference film 201 coincide with each other in the lamination direction.

The second relative position is a position where the mutually same phase difference regions of the patterned phase difference films 101 and 201 coincide with each other in the lamination direction. That is, in this case, the first phase difference region 111 of one patterned phase difference film 101 and the first phase difference region 211 of the other patterned phase difference film 201 coincide with each other in the lamination direction and the second phase difference region 112 of one patterned phase difference film 101 and the second phase difference region 212 of the other patterned phase difference film 201 coincide with each other in the lamination direction.

The viewing angle switching system 60 of the embodiment is configured such that one viewing angle switching polarizing plate 51 is movable in a direction of an arrow M in the drawing by the width of one stripe shape (one stripe width) which is the first or second phase difference region. By shifting the viewing angle switching polarizing plate 51 in the M direction by one stripe, it is possible to switch between the normal viewing angle and the narrow viewing angle.

The viewing angle switching system 60 comprises a moving mechanism (not shown) for sliding at least one of the viewing angle switching polarizing plates in the width direction by one stripe so as to achieve the first relative position and the second relative position. As the moving mechanism, a known sliding mechanism can be appropriately used. In a case of adopting a configuration in which the first relative position and the second relative position are mechanically switched, such as a slide mechanism that slides the viewing angle switching polarizing plate 51 by one stripe width by turning a dial by a user, and slides the viewing angle switching polarizing plate to the opposite direction by one stripe and returns the viewing angle switching polarizing plate to the original position by turning the dial again, power supply is not required and thus this case is preferable.

The patterned phase difference film included in the viewing angle switching system is not limited to the patterned phase difference film 1 of the first embodiment and it is needless to say that the patterned phase difference film 2 of the second embodiment may be used. Further, the patterned phase difference film 3 in which the first phase difference region and the second phase difference region shown in FIG. 3 are arranged in a check pattern may be used. In a case of using the patterned phase difference film 3 of a check pattern shown in FIG. 3, the sliding direction may be any of vertical and horizontal directions.

The display device of the embodiment of the present invention comprises a display panel and the viewing angle switching system that is arranged on a viewing side surface of the display panel. As shown in FIG. 6, a display device 100 of an embodiment is configured such that the viewing angle switching system 60 is arranged on a viewing side surface of a liquid crystal panel 70.

The liquid crystal panel 70 has a configuration in which liquid crystal cells 71 are interposed between polarizers 72 and 73 which are orthogonal to each other. The backlight is omitted. The polarizer 73 on the viewing side of the liquid crystal panel 70 also functions as a polarizer 204 of the viewing angle switching polarizing plate 52 of the two viewing angle switching polarizing plates 51 and 52 constituting the viewing angle switching system 60 on the side of the liquid crystal panel 70.

Figure 7:
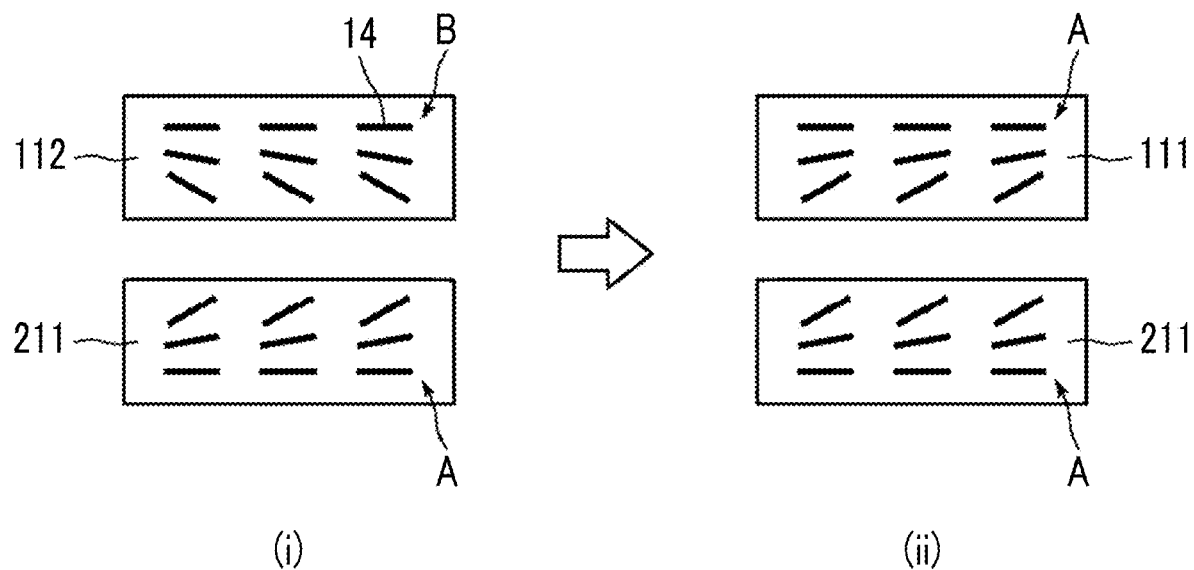
FIG. 7 is a view schematically showing a part of the viewing angle switching system in a normal viewing angle display mode and a narrow viewing angle display mode.

FIG. 7 schematically shows part of facing patterned phase difference films in (i) normal viewing angle display mode and in (ii) narrow viewing angle display mode.

In the normal viewing angle display mode, as shown in (i) of FIG. 7, the second phase difference region 112 of one patterned phase difference film faces the first phase difference region 211 of the other patterned phase difference film and the regions are super in the lamination direction. In this case, the first hybrid alignment liquid crystal group A and the second hybrid alignment liquid crystal group B in the form of a hybrid alignment with mutually opposite directions over the entire surface face to each other. In this case, since the directions of the hybrid alignments of the both hybrid alignment liquid crystal groups are opposite to each other, a phase difference in the mutually oblique directions with respect to the light traveling in the lamination direction is canceled and the mutual phase difference is compensated. Therefore, the viewing angle switching system has no influence on the light emitted from the display panel and passing through the system and a normal viewing angle of the display panel is obtained.

On the other hand, in the narrow viewing angle display mode, as shown in (ii) of FIG. 7, the phase difference regions 111 and 211 of the two patterned phase difference films with the same hybrid alignment direction face to each other and are stacked in the lamination direction. In this case, the first hybrid alignment liquid crystal groups A and the second hybrid alignment liquid crystal groups B with the same hybrid alignment direction over the entire surface face to each other. In this case, since there is a phase difference in the mutually same oblique direction of the films, the phase difference is not compensated and a phase difference is generated in the oblique direction as a whole (from a direction normal to the film surface to a direction oblique to the film surface). As a result, a viewing angle narrower than the normal viewing angle of the display panel is obtained.

Figure 8:
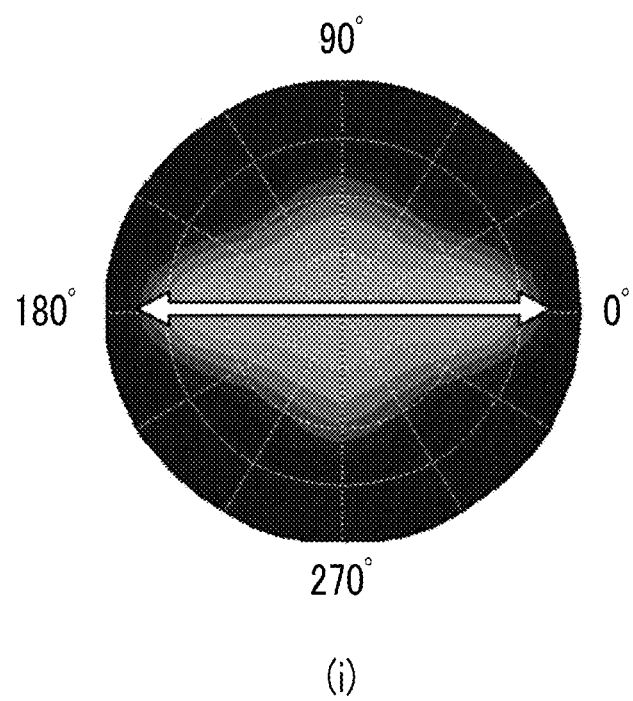
FIG. 8 is a view showing a luminance distribution in a normal viewing angle display mode.
Figure 9:
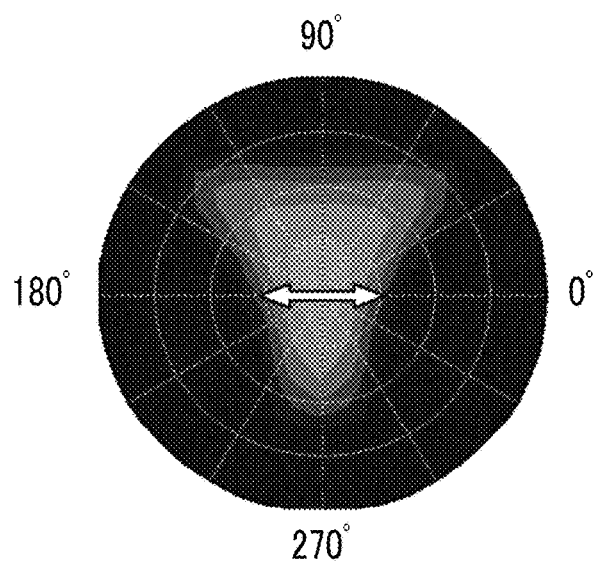
FIG. 9 is a view showing a luminance distribution in a narrow viewing angle display mode.

FIGS. 8 and 9 are views showing a luminance distribution in (i) normal viewing angle display mode and in (ii) narrow viewing angle display mode, respectively. In a case where the viewing angle switching system is arranged on the light emitting point and each mode is set, a viewing angle luminance distribution (azimuth angle, polar angle) is obtained by simulation and two-dimensionally displayed by polar coordinates. The left and right direction in the drawing is a horizontal direction and the up and down direction is a vertical direction. The right side is an azimuth angle of 0 degrees, the upper side is an azimuth angle of 90 degrees, the left side is an azimuth angle of 180 degrees, and the lower side is an azimuth angle of 270 degrees. In addition, the distance from the center of the circle represents the polar angle from the front direction, and the polar angle is in the range of 0 degrees to 80 degrees.

Here, the viewing angle switching system shown in FIG. 6 is arranged such that the stripe length direction of the viewing angle switching system coincides with the axis from 0° to 180°. In the narrow viewing angle display mode, it is obvious that the viewing angle in the line from 0° to 180° is considerably narrower than the normal viewing angle.

Figure 10:
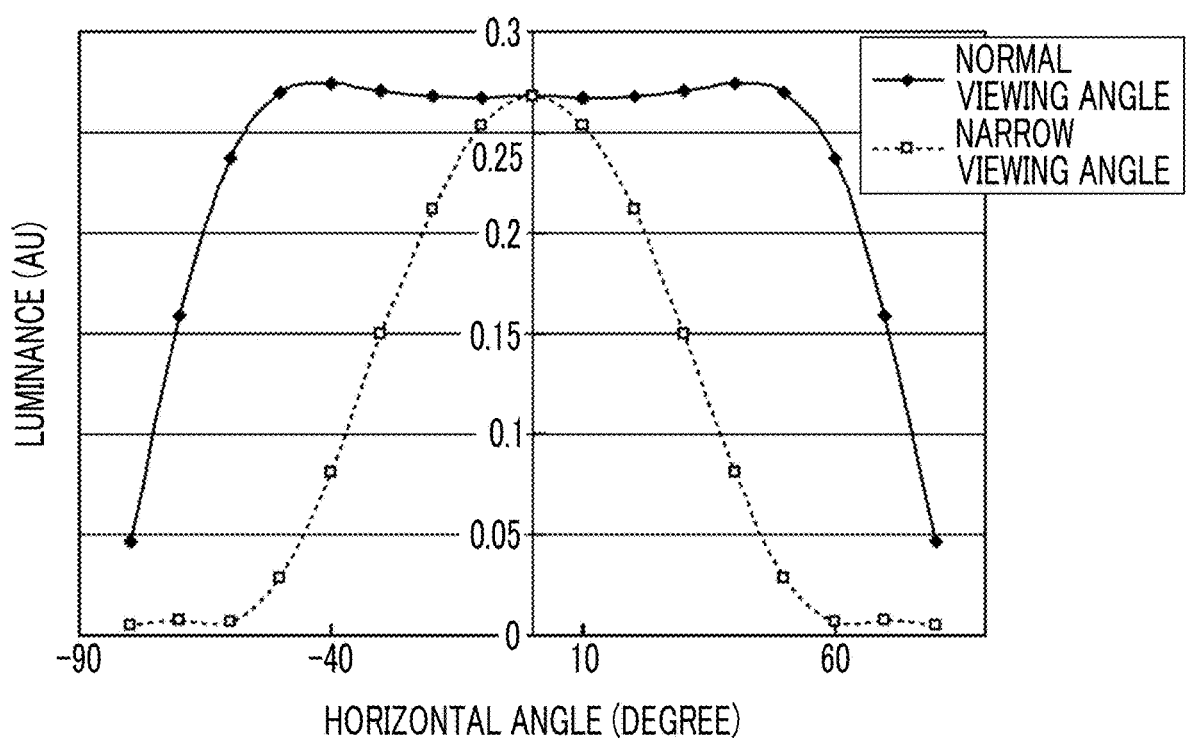
FIG. 10 is a graph showing horizontal angle dependence of luminance in a normal viewing angle display mode and a narrow viewing angle display mode.

FIG. 10 is a graph showing a luminance distribution at the horizontal angle of −90° to 90° in each of the normal viewing angle display mode and the narrow viewing angle display mode. The positive direction of the horizontal angle corresponds to an azimuth angle of 0 degrees in FIGS. 8 and 9, the negative direction corresponds to an azimuth angle of 180 degrees in FIGS. 8 and 9, and the magnitude of the angle corresponds to the polar angle in FIGS. 8 and 9. As shown in FIG. 10, it is found that in the narrow viewing angle mode, the visually recognizable angle region is sharply reduced as the visually recognizable angle region is away from a horizontal angle of 0 degrees (that is, the front surface), and the viewing angle is greatly reduced.

Therefore, in the display device in which the viewing angle switching system is arranged to be stacked on the normal display panel, an appropriate display even from the horizontal direction is normally visually recognizable by switching between the display at the normal viewing angle and the display at the narrow viewing angle with a limited viewing angle, and if necessary, by switching the normal viewing angle mode to the narrow viewing angle mode, for example, it is possible to prevent the display from being peeped by the peripheral third party.

As the display panel, various display elements (display panels) used for known display devices used for mobile phones such as a tablet PC, a laptop PC, a smart phone, and the like can be used. Specifically, in addition to the above-described liquid crystal panel, an organic electroluminescence (EL) display panel, a plasma display panel, an electronic paper, and the like are exemplified.

Figure 11:
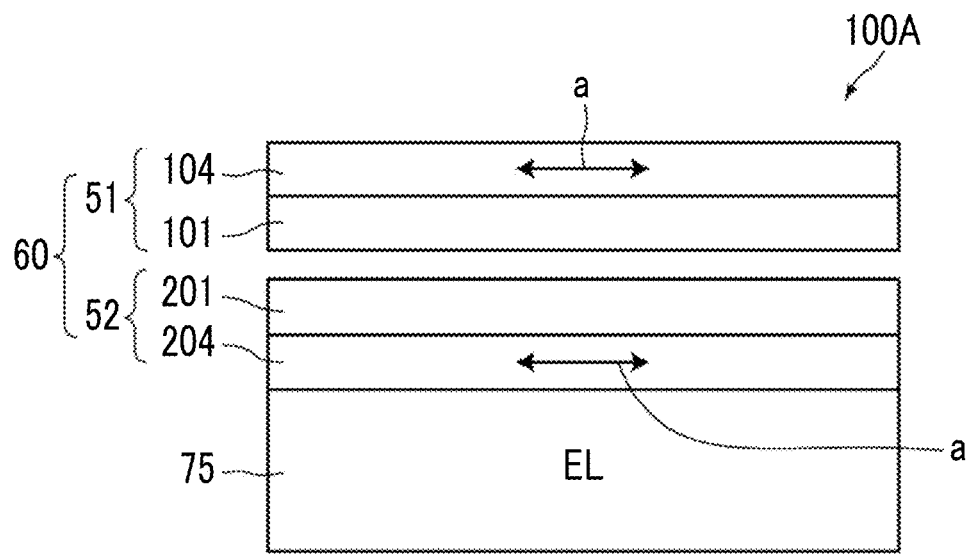
FIG. 11 is a schematic cross-sectional view showing another example of the display device of the present invention.

FIG. 11 shows a schematic configuration of a display device 100A comprising an organic EL panel 75 as a display panel. The display device 100A comprises the viewing angle switching system 60 on the viewing screen of the organic EL panel 75.

As described above, as in a case where the display device 100A comprising the liquid crystal panel 70, in the normal viewing angle mode, the screen can be visually recognized at the normal viewing angle of the organic EL panel 75 itself, in the narrow viewing angle mode, the viewing angle in the horizontal direction is narrowed, and the screen visibility from the peripheral third party is lowered. Thus, it is possible to prevent the screen from being peeped by the third party.

EXAMPLES

<Method of Preparing Patterned Phase Difference Film>

For Examples and Comparative Examples, each patterned phase difference film having an optically anisotropic layer including a first phase difference region and a second phase difference region was prepared by forming an alignment film on a support film, performing pattern rubbing on the alignment film and then forming an optically anisotropic layer on the alignment film.

As a support film, a cellulose acylate film was used. Specifically, Z-TAC (trade name) manufactured by Fujifilm Corporation was used.

(Formation of Alignment Film)

The surface of the cellulose acylate film was subjected to a saponification treatment, and an alignment film coating solution of the composition shown in Table 1 below was applied to the saponified surface using a #14 wire bar. The coating film was dried for 60 seconds with warm air at 60° C. and further dried for 120 seconds with warm air at 100° C. to form an alignment film. The formed film was subjected to a rubbing treatment.

TABLE 1

| Composition of alignment film coating solution | |
| --- | --- |
| Modified polyvinyl alcohol represented by chemical formula below | 10 parts by mass |
| Water | 371 parts by mass |
| Methanol | 119 parts by mass |
| Glutaraldehyde | 0.5 parts by mass |

Figure 12:
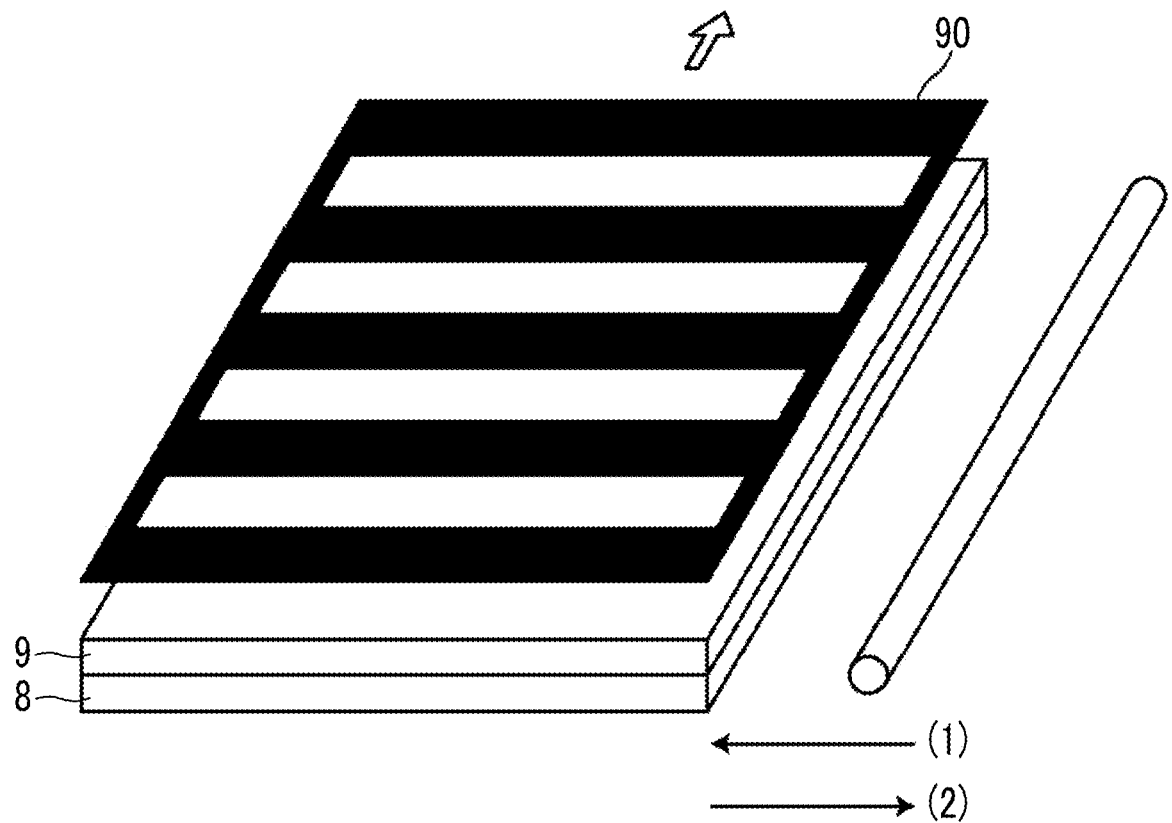
FIG. 12 is a view for explaining a method of preparing a patterned alignment film.

Modified polyvinyl alcohol $-(CH_2-CH)_{86.3}-(CH_2-CH)_{12}-(CH_2-CH)_{1.7}- \quad CH_3$
$\quad\quad\quad |\quad\quad\quad\quad\quad |\quad\quad\quad\quad\quad\quad |\quad\quad\quad\quad\quad\quad\quad |$
$\quad\quad\quad OH \quad\quad\quad OCOCH_3 \quad\quad OCONHCH_2CH_2OCOC=CH_2$ The alignment film formed as described above was subjected to pattern rubbing. For the pattern rubbing, a mask rubbing method was used with reference to the method of JP2004-163495A. FIG. 12 is a schematic view for explaining a pattern rubbing method. As shown in FIG. 12, a stripe pattern mask 90 in which a plurality of stripe-shaped openings were arranged in parallel to each other and arranged at the width interval the same as the stripe width and was arranged on the uniform alignment film 9 formed on the support film 8. Then, rubbing was performed in parallel to one direction (1) in the length direction of the stripe from the right side to the left side in the drawing, then the mask 90 was arranged to be shifted in the width direction of the stripe by one width of the stripe-shaped opening, and rubbing was performed in the other direction (2) in the length direction of the stripe from the left side to the right side in the drawing. By this treatment, a patterned alignment film was produced in which stripe-shaped regions rubbed in mutually opposite directions were alternately prepared. In this case, the width of the pattern was 5 mm.

Each of optically anisotropic layer coating solutions shown in Table 2 below for each of Examples and Comparative Examples was applied to the patterned alignment film while adjusting the coating amount, and the coating solution was fixed by ultraviolet curing. The optically anisotropic layer is a patterned phase difference layer having a first phase difference region in the stripe-shaped region rubbed and aligned in a first direction and a second phase difference region in the stripe-shaped region rubbed in a second direction.

The patterned phase difference films of each of Examples and Comparative Examples were prepared by the above procedure.

In each of Examples and Comparative Examples, an optically anisotropic layer was prepared using any coating solution of the following D1 to D5 and R1 for each of Examples as the optically anisotropic layer coating solution.

TABLE 2

| | Optically anisotropic layer coating solution |
| --- | --- |
| Example 1 | D1 |
| Example 2 | R1 |
| Example 3 | D3 |
| Example 4 | D4 |
| Example 5 | D1 |
| Example 6 | D1 |
| Comparative Example 1 | D2 |
| Comparative Example 2 | D5 |
| Comparative Example 3 | D1 |
| Comparative Example 4 | D1 |

The compositions of the optically anisotropic layer coating solutions D1 to D5 were as shown in Table 3 below. All units are parts by mass.

TABLE 3

| Optically anisotropic layer coating solution | | | | | | |
| --- | --- | --- | --- | --- | --- | --- |
| | Material | D1 | D2 | D3 | D4 | D5 |
| Discotic liquid crystal | Triphenylene derivative (Chemical formula below: D) | 91 | 91 | 91 | 91 | 91 |
| Isotropic phase transition point temperature lowering agent | Trimethylolpropane EO added triacrylate: VISCOAT #360 (manufactured by Osaka Organic Chemical Industry Ltd.) | 9 | 9 | 9 | 9 | 9 |
| Polymerization initiator | α-amino ketone: Irgacure 907 (manufactured by BASF) | 3 | 3 | 3 | 3 | 3 |
| Sensitizer | Diethylthioxanthone (DETX) | 1 | 1 | 1 | 1 | 1 |
| Wind unevenness preventing and tilt adjusting agent | Fluorine-based methacrylate copolymer (Chemical formula below: F1) | — | 0.8 | 0.7 | — | — |
| | Fluorine-based acrylate copolymer (Chemical formula below: F2) | 0.1 | — | — | 0.5 | 0.2 |
| | Fluorine-based acrylate copolymer (Chemical formula below: F3) | 0.7 | — | 0.1 | — | — |

TABLE 3-continued
| Optically anisotropic layer coating solution Material | D1 | D2 | D3 | D4 | D5 |
|---|---|---|---|---|---|
| Fluorine-based acrylate copolymer (Chemical formula below: F4) | — | — | — | 0.3 | 0.6 |
D
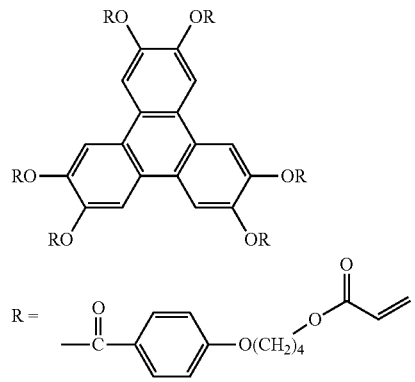
VISCOAT #360
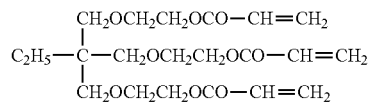
Irgacure 907 (manufactured by BASF)
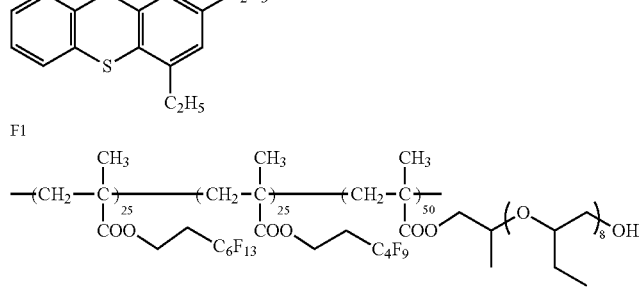
Diethylthioxanthone (DETX)
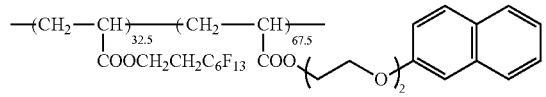
F1
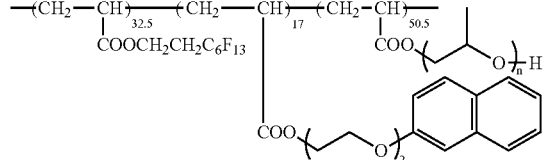
F2, F3, F4
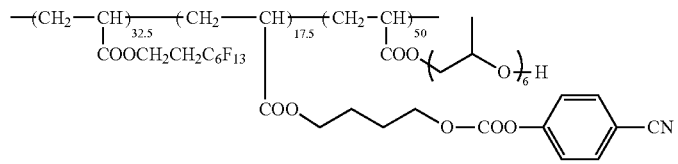

The composition of the optically anisotropic layer coating solution R1 was shown in Table 4 below. All units are parts by mass.

TABLE 4

| Optically anisotropic layer coating solution R1 | |
| --- | --- |
| Rod-like liquid crystal compound represented by chemical formula below | 14.5 |
| Fluorine-based surfactant represented by chemical formula below | 0.03 |
| Sensitizer: Diethylthioxanthone (DETX) | 0.15 |
| Photopolymerization initiator: Irgacure 907 (manufactured by BASF) | 0.29 |
| Methyl ethyl ketone | 233.6 |
| Fluorine-containing compound represented by chemical formula below | 0.03 |

Rod-like liquid crystal compound

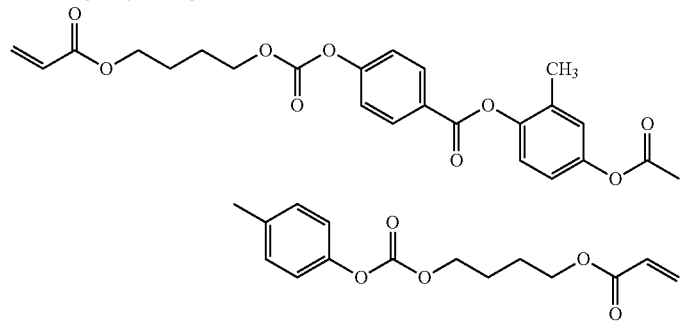

Fluorine-based surfactant

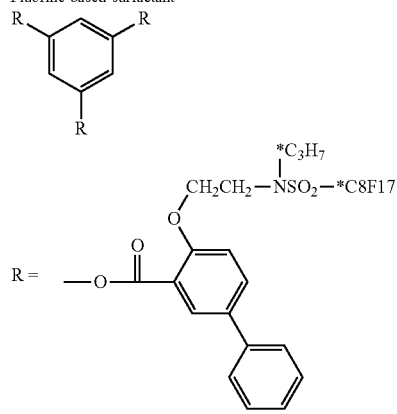

Fluorine-containing compound

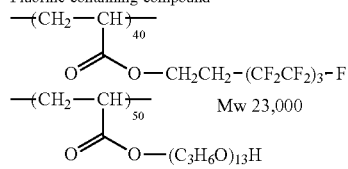

<Measurement of Phase Difference>

Regarding the patterned phase difference film of each of Examples and Comparative Examples obtained as described above, phase differences R(0), R(40), and R(−40) were measured using Axoscan manufactured by Axometrics Co. Ltd. The results are shown in Table 5. The sign of the phase difference of the rod-like liquid crystal is opposite to that of the phase difference of the DLC. This is because while the in-plane slow axis is parallel to the rubbing direction in a case of the rod-like liquid crystal, the in-plane fast axis is parallel to the rubbing direction in a case of the DLC. In the present specification, the absolute value of the retardation is important and thus is written in absolute value without regard to the sign.

<Evaluation>

A case where two patterned phase difference films of each of Examples and Comparative Examples were used and stacked so that the anisotropic layer was arranged inside, and the first phase difference regions and the second phase difference regions were stacked was set to a narrow viewing angle display mode, and a case where the first phase difference region and the second phase difference region were stacked was set to a normal viewing angle (wide viewing angle) display mode (refer to FIG. 6), and then evaluation was performed. The two films were stacked on a liquid crystal panel of a liquid crystal display device (liquid crystal monitor: LP2065 manufactured by Hewlett Packard Enterprise Development LP) such that the length direction of each stripe is directed to the horizontal direction (left and right direction) to an observer, and a polarizing plate was further stacked thereon. The direction of the absorption axis of the polarizing plate was set to the same direction of the viewing side polarizing plate of the liquid crystal display device (refer to FIG. 6).

The liquid crystal display device was set to white display, and the luminance at 60° (a polar angle of 60°) in left and right oblique directions at a narrow viewing angle (a comparative value when the luminance in a case where the patterned phase difference film was not provided was set to 1) was measured. For the measurement, BM-5A manufactured by Topcon Corporation was used. The luminance was evaluated based on the following standards. The results are shown in Table 5.

A: The luminance was less than 0.1 (nearly black with sufficient narrow viewing angle effect).

B: The luminance was 0.1 or more and 0.2 or less (slightly black with sufficient narrow viewing angle effect (acceptable)).

C: The luminance was more than 0.2 and 0.5 or less (insufficient black with insufficient narrow viewing angle effect (unacceptable)).

D: The luminance was more than 0.5 (not black with no sufficient narrow viewing angle effect).

In addition, the performance of switching between a wide viewing angle and narrow viewing angle was visually evaluated based on the following standards A to D by displaying an image on the liquid crystal display device. Here, in each case of a wide viewing angle and a narrow viewing angle, observation was made at 60 degrees (a polar angle of 60°) in left and right oblique directions. The evaluation results are shown in Table 5.

A: While the image was clearly recognized at a wide viewing angle, the image became completely black and was invisible at a narrow viewing angle and a sufficient switching effect was obtained.

B: While the image was clearly recognized at a wide viewing angle, the image was nearly black and was almost invisible at a narrow viewing angle and a practically acceptable switching effect was obtained (acceptable).

C: While the image was clearly recognized at a wide viewing angle, the image became slightly black and was visible at a narrow viewing angle and the switching effect was not sufficient (unacceptable).

D: While the image was clearly recognized at a wide viewing angle, the image did not become black and was visible at a narrow viewing angle and no switching effect was obtained.

As shown in Table 5, in each of Examples 1 to 6, the evaluation was A or B, whereas in each of Comparative Examples 1 to 4, the evaluation was C. Very good results were obtained in Examples 1 and 2.

The patterned phase difference film of the embodiment of the present invention is used for a viewing angle switching polarizer for controlling the viewing angle of a display device and a viewing angle switching system, as described above, and also can be used for a dimming window, a switching element for optical communication, a backlight, a lighting directivity changeover switch, and the like.

The display device of the embodiment of the present invention can be preferably used as a display device for a tablet PC, a laptop PC, a smartphone, and the like.

EXPLANATION OF REFERENCES 1, 1A, 2, 3, 101, 201: patterned phase difference film
4, 104, 204: polarizer
8: support film
9: alignment film
10, 20: optically anisotropic layer
10a, 10b, 20a, 20b: film surface
11, 21, 31, 111, 211: first phase difference region
12, 22, 32, 112, 212: second phase difference region
14: DLC molecule
15: rod-like liquid crystal molecule
50, 51, 52: viewing angle switching polarizing plate
60: viewing angle switching system
70: liquid crystal panel
71: liquid crystal cell
72, 73: polarizer
75: organic EL panel
90: mask
100, 100A: display device
A: first hybrid alignment liquid crystal group
B: second hybrid alignment liquid crystal group

What is claimed is:
1. A patterned phase difference film comprising:
an optically anisotropic layer alternately having a first phase difference region and a second phase difference region,

TABLE 5

| | | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|---|
| Patterned phase difference film | Optically anisotropic layer coating solution | D1 | R1 | D3 | D4 | D1 | D1 | D2 | D5 | D1 | D1 |
| | R (40) (nm) | 189 | 192 | 135 | 353 | 159 | 218 | 119 | 400 | 130 | 248 |
| | R (0) (nm) | 64 | 64 | 64 | 64 | 54 | 74 | 64 | 64 | 44 | 84 |
| | R (−40) (nm) | 10 | 11 | 24 | 28 | 8 | 12 | 29 | 50 | 7 | 13 |
| Shielding effect evaluation based on luminance measured at 60° in left and right oblique directions at narrow viewing angle | | A | A | B | B | B | B | C | C | C | C |
| Visual functional evaluation on switching performance | | A | A | B | B | B | B | C | C | C | C | wherein the first phase difference region and the second phase difference region contain rod-like liquid crystals or discotic liquid crystals in the form of a hybrid alignment with mutually opposite rising directions of tilt angles, directions of in-plane slow axes and absolute values of in-plane phase differences of the first phase difference region and the second phase difference region are equal and the absolute values of in-plane phase differences are 54 to 74 nm, and when in a case where the first phase difference region and the second phase difference region contain the rod-like liquid crystals, an in-plane slow axis is set to an x axis, and in a case where the first phase difference region and the second phase difference region contain the discotic liquid crystals, an in-plane fast axis is set to an x axis, and a direction vertical to a film surface is set to a z axis, in each of the first phase difference region and the second phase difference region, one of an absolute value of a phase difference at a polar angle of 40° and an absolute value of a phase difference at a polar angle of −40° in an xz plane is 135 to 353 nm and the other is 8 to 28 nm.

2. The patterned phase difference film according to claim 1,
wherein the first phase difference region and the second phase difference region have the same stripe shape and are alternately arranged in a width direction of the stripe shape.

3. The patterned phase difference film according to claim 2,
wherein in a case where the first phase difference region and the second phase difference region contain the rod-like liquid crystals, an in-plane slow axis coincides with a length direction of the stripe shape, and in a case where the first phase difference region and the second phase difference region contain the discotic liquid crystals, an in-plane fast axis coincides with the length direction of the stripe shape.

4. The patterned phase difference film according to claim 1,
wherein the first phase difference region and the second phase difference region have the same rectangular shape and are alternately arranged in a check pattern in vertical and horizontal directions.

5. A viewing angle switching polarizing plate comprising:
the patterned phase difference film according to claim 1; and
a polarizer,
wherein the patterned phase difference film and the polarizer are laminated,
an in-plane slow axis in a case where the first phase difference region and the second phase difference region of the patterned phase difference film contain the rod-like liquid crystals, or an in-plane fast axis in a case where the first phase difference region and the second phase difference region of the patterned phase difference film contain the discotic liquid crystals, and an absorption axis of the polarizer are parallel to each other.

6. A viewing angle switching system comprising:
two viewing angle switching polarizing plates according to claim 5,
wherein the two viewing angle switching polarizing plates are arranged such that the absorption axes of the polarizers are parallel to each other and the patterned phase difference films face each other, and are provided to be relatively movable between a first relative position and a second relative position,
the first relative position is a position where mutually different phase difference regions of the patterned phase difference films arranged to face each other coincide with each other in a lamination direction, and
the second relative position is a position where the mutually same phase difference regions of the patterned phase difference films arranged to face each other coincide with each other in the lamination direction.

7. A display device comprising:
a display panel; and
the viewing angle switching system according to claim 6 that is arranged on a viewing side surface of the display panel.

8. The display device according to claim 7,
wherein the display panel is a liquid crystal panel, and a polarizer on a viewing side of the liquid crystal panel also functions as a polarizer of a viewing angle switching polarizing plate on a side of the liquid crystal panel of the two viewing angle switching polarizing plates constituting the viewing angle switching system.

* * * * *